(12) United States Patent
Bae et al.

(10) Patent No.: US 12,446,406 B2
(45) Date of Patent: Oct. 14, 2025

(54) DISPLAY DEVICE

(71) Applicant: Samsung Display Co., Ltd., Yongin-si (KR)

(72) Inventors: Kwang Soo Bae, Yongin-si (KR); Min Jeong Oh, Gimpo-si (KR); Sang Hyun Choi, Seoul (KR); Chaun Gi Choi, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 597 days.

(21) Appl. No.: 17/723,298

(22) Filed: Apr. 18, 2022

(65) Prior Publication Data
US 2022/0392978 A1 Dec. 8, 2022

(30) Foreign Application Priority Data

Jun. 4, 2021 (KR) .................. 10-2021-0072662

(51) Int. Cl.
*H10K 59/122* (2023.01)
*H10K 50/84* (2023.01)
(Continued)

(52) U.S. Cl.
CPC .......... *H10K 59/122* (2023.02); *H10K 50/84* (2023.02); *H10K 50/865* (2023.02);
(Continued)

(58) Field of Classification Search
None
See application file for complete search history.

(56) References Cited

U.S. PATENT DOCUMENTS 10,651,427 B2  5/2020  Youn et al.
10,896,939 B2  1/2021  Jeon et al.
(Continued)

FOREIGN PATENT DOCUMENTS

JP      2019083190 A    5/2019
KR  10-2019-0080312    7/2019
(Continued)

OTHER PUBLICATIONS

Extended European Search Report dated Oct. 17, 2022, issued to European Patent Application No. 22176295.8.

*Primary Examiner* — Kyoung Lee
(74) *Attorney, Agent, or Firm* — CANTOR COLBURN LLP

(57) ABSTRACT

A display device includes a base substrate; a thin-film transistor disposed on the base substrate; a via layer disposed on the thin-film transistor and having a via hole formed therein, the via hole penetrating the via layer in a thickness direction; a first electrode disposed on the via layer and having an electrode hole formed therein, the electrode hole penetrating the first electrode in the thickness direction; a bank layer disposed on the first electrode and exposing part of a top surface of the first electrode; an emission layer on the first electrode; and a second electrode on the emission layer, wherein the first is electrically connected to the thin-film transistor through the via hole, and the bank layer includes an outer bank pattern, which overlaps with the via hole in the thickness direction, and a bank island pattern, which is disposed in the electrode hole.

20 Claims, 17 Drawing Sheets

(51) Int. Cl.
    *H10K 50/86*       (2023.01)
    *H10K 59/123*     (2023.01)
    *H10K 59/38*       (2023.01)
    *H10K 59/40*       (2023.01)
    *H10K 59/80*       (2023.01)

(52) U.S. Cl.
    CPC ........... H10K 59/123 (2023.02); H10K 59/38 (2023.02); H10K 59/40 (2023.02); H10K 59/8792 (2023.02); *H10K 59/8731* (2023.02)

(56) References Cited

U.S. PATENT DOCUMENTS

| | | | |
|---|---|---|---|
| 2011/0204771 A1* | 8/2011 | Lee | H10K 59/876 |
| | | | 313/504 |
| 2015/0362776 A1 | 12/2015 | Jikumaru et al. | |
| 2017/0062528 A1* | 3/2017 | Aoyama | H10K 59/122 |
| 2017/0294493 A1 | 10/2017 | Yoo et al. | |
| 2018/0190731 A1* | 7/2018 | Park | G09G 3/3225 |
| 2020/0058901 A1 | 2/2020 | Choi et al. | |
| 2020/0105845 A1 | 4/2020 | Yang et al. | |
| 2020/0212111 A1 | 7/2020 | Kim et al. | |
| 2020/0235172 A1* | 7/2020 | Lee | H10K 59/122 |
| 2020/0266392 A1 | 8/2020 | Lee | |

FOREIGN PATENT DOCUMENTS

| | | |
|---|---|---|
| KR | 20190096472 A | 8/2019 |
| KR | 10-2020-0080729 | 7/2020 |

\* cited by examiner

DISPLAY DEVICE

CROSS-REFERENCE TO RELATED APPLICATION

This application claims priority to Korean Patent Application No. 10-2021-0072662, filed on Jun. 4, 2021, which is hereby incorporated by reference for all purposes as if fully set forth herein.

BACKGROUND

Field

The present disclosure relates to a display device.

DISCUSSION OF THE BACKGROUND

Recently, due to developments in technology, display products having a small size and light weight, but having excellent performance, are being produced. Conventionally, cathode ray tubes (CRTs) have been widely used as display devices because of their numerous advantages in terms of performance and price, but compact-size, light-weight, and low-power consuming display devices such as a plasma display panel (PDP) device, a liquid crystal display (LCD) device, an organic light-emitting diode (OLED) display device, or the like have attracted attention.

A display device includes a display panel that displays a screen, and the demand for mid-size display panels capable of displaying a large-size screen has increased. Mid-size display panels may be accompanied by increases in the aperture ratio of pixels as compared to mid- to small-size display panels. In this case, the reflectance of display panels for external light may be varied, and thus, new attempts are needed to reduce the reflectance of display panels for external light.

The above information disclosed in this Background section is only for understanding of the background of the inventive concepts, and, therefore, it may contain information that does not constitute prior art.

SUMMARY

Embodiments described herein provide a display device including a display panel having a reduced external light reflectance.

Additional features of the inventive concepts will be set forth in the description that follows, and in part will be apparent from the description, or may be learned by practice of the inventive concepts.

According to an embodiment, a display device comprises a base substrate; a thin-film transistor disposed on the base substrate; a via layer disposed on the thin-film transistor and having a via hole formed therein, the via hole penetrating the via layer in a thickness direction; a first electrode disposed on the via layer and having an electrode hole formed therein, the electrode hole penetrating the first electrode in the thickness direction; a bank layer disposed on the first electrode and exposing part of a top surface of the first electrode; an emission layer on the first electrode; and a second electrode on the emission layer, wherein the first is electrically connected to the thin-film transistor through the via hole, and the bank layer includes an outer bank pattern, which overlaps with the via hole in the thickness direction, and a bank island pattern, which is disposed in the electrode hole.

According to an embodiment, a display device comprises a first emission area emitting light of a first color; and a second emission area emitting light of a second color, which is different from the first color, wherein each of the first and second emission areas includes a base substrate, a thin-film transistor disposed on the base substrate, a via layer disposed on the thin-film transistor and having a via hole formed therein, the via hole penetrating the via layer in a thickness direction, a first electrode disposed on the via layer and having an electrode hole formed therein, the electrode hole penetrating the first electrode in the thickness direction, a bank layer disposed on the first electrode and exposing part of a top surface of the first electrode, an emission layer on the first electrode, and a second electrode on the emission layer, the first is electrically connected to the thin-film transistor through the via hole, and the bank layer includes an outer bank pattern, which overlaps with the via hole in the thickness direction, and a bank island pattern, which is disposed in the electrode hole.

According to the aforementioned and other embodiments, a display device having a reduced peripheral area, which is a non-display area, can be provided.

Other features and embodiments may be apparent from the following detailed description, the drawings, and the claims.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
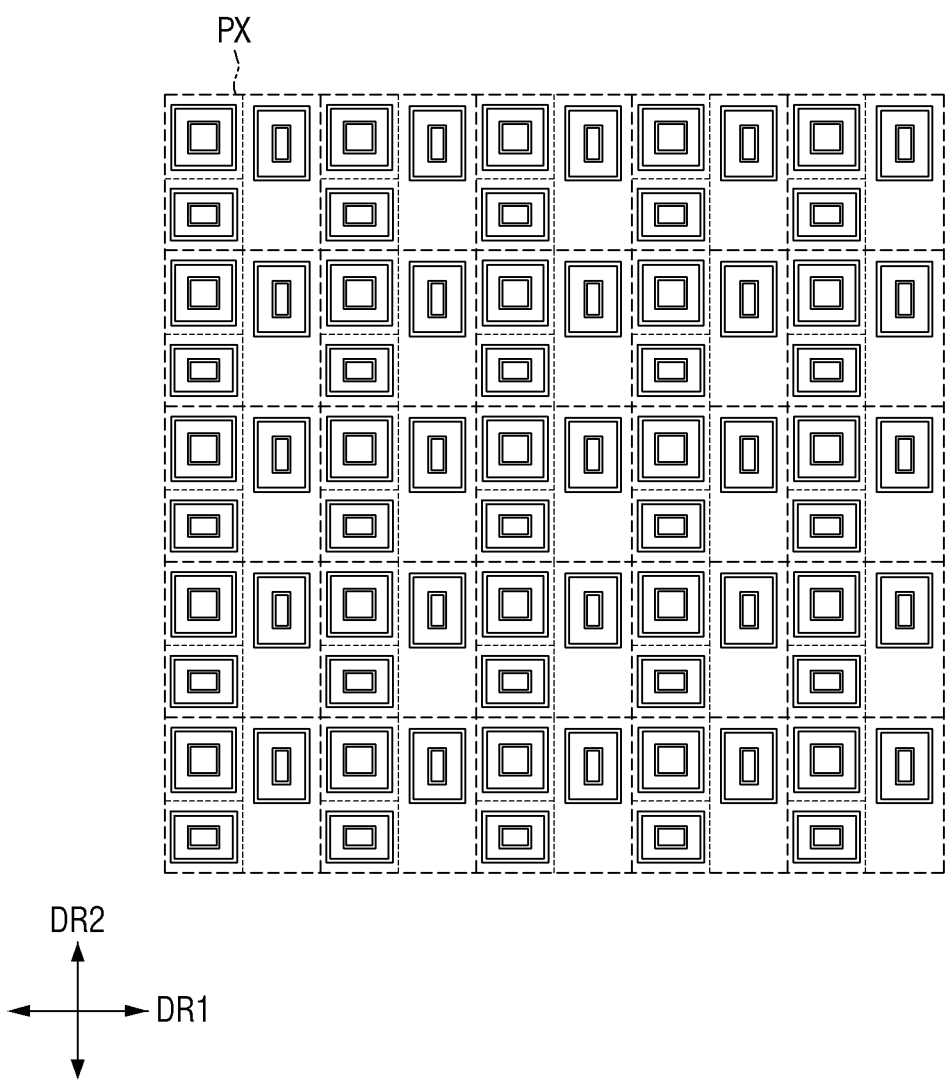
FIG. 1 is a plan view illustrating pixels of a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the invention will be described with reference to the attached drawings.

Figure 2:
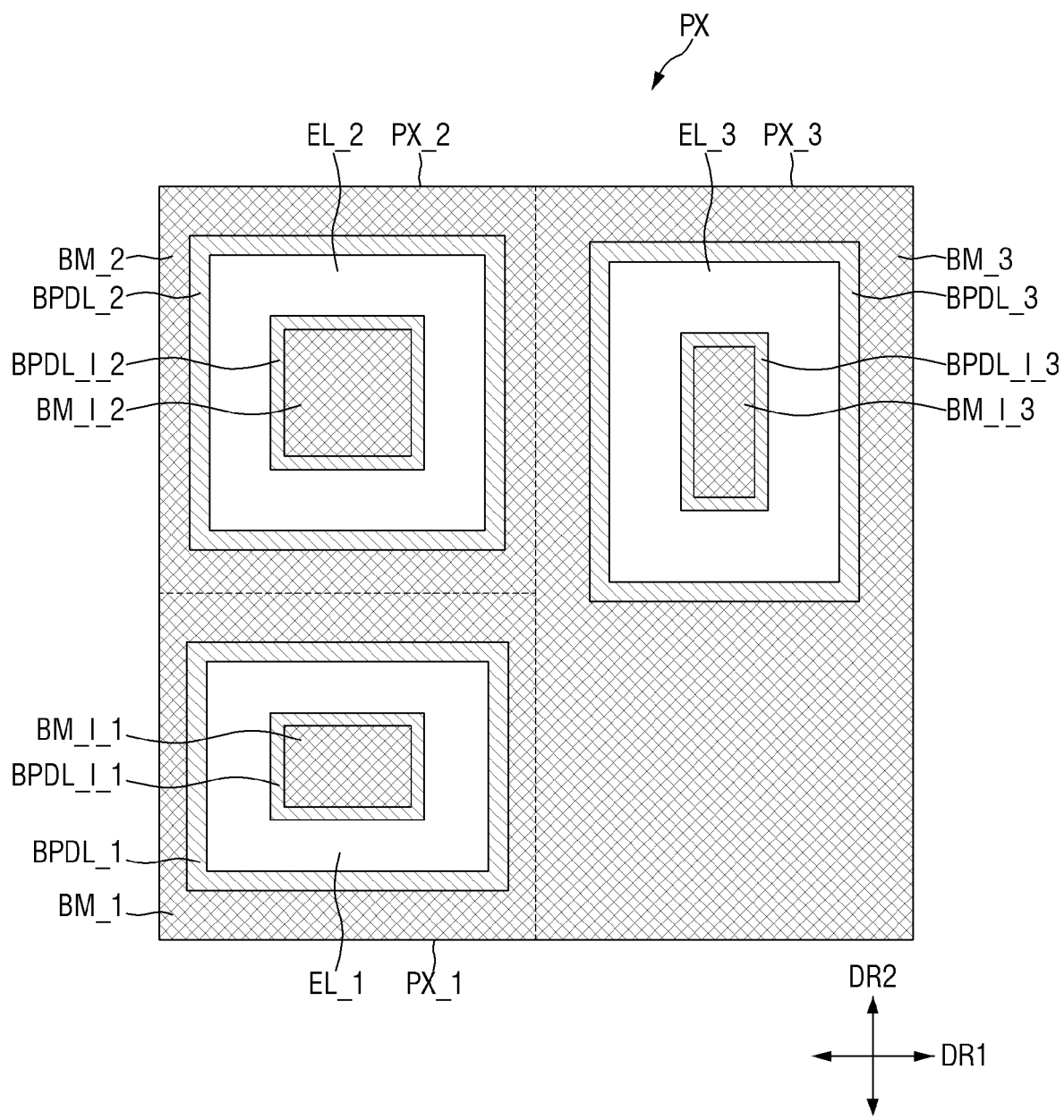
FIG. 2 is an enlarged plan view of a pixel of FIG. 1.

FIG. 1 is a plan view illustrating pixels of a display device according to an embodiment that is constructed according to principles of the invention. FIG. 2 is an enlarged plan view of a pixel of FIG. 1.

Referring to FIGS. 1 and 2, the display device may include a plurality of pixels PX. The pixels PX may be arranged in a matrix along a first direction DR1 and a second direction DR2, which intersects the first direction DR1. However, the pattern of arrangement of the pixels PX is not particularly limited, but may vary.

The pixels PX may have a rectangular or square shape in a plan view. That is, each of the pixels PX may have first sides that extend in the first direction DR1 and second sides that extend in the second direction DR2. For convenience, sides of each of subpixels of each of the pixels PX that extend in the first direction DR1 will hereinafter be referred to as first sides, and sides of each of the subpixels of each of the pixels PX that extend in the second direction DR2 will hereinafter be referred to as second sides.

As illustrated in FIG. 2, a pixel PX may include a plurality of subpixels. The subpixels of the pixel PX may generate light of different colors. In one example, the subpixels of the pixel PX may include first, second, and third subpixels PX_1, PX_2, and PX_3.

The first, second, and third subpixels PX_1, PX_2, and PX_3 may generate light of first, second, and third colors, respectively.

The first, second, and third subpixels PX_1, PX_2, and PX_3 may be red, green, and blue subpixels, respectively. That is, the first, second, and third colors may be red, green, and blue, respectively.

In some embodiments, the subpixels of the pixel PX may further include a fourth subpixel, which generates white light. The subpixels of the pixel PX will hereinafter be described as including the first, second, and third subpixels PX_1, PX_2, and PX_3.

As illustrated in FIG. 2, the first subpixel PX_1 may be disposed adjacent to a first side of the pixel PX on the other side, in the second direction DR2, of the pixel PX and to a second side of the pixel PX on the other side, in the second direction DR2, of the pixel PX, the second subpixel PX_2 may be disposed adjacent to a first side of the pixel PX on one side, in the second direction DR2, of the pixel PX and to a second side of the pixel PX on the other side, in the first direction DR1, of the pixel PX, and the third subpixel PX_3 may be disposed adjacent to the first side of the pixel PX on one side, in the second direction DR2, of the pixel PX and to a second side of the pixel PX on one side, in the first direction DR1, of the pixel PX.

The first, second, and third subpixels PX_1, PX_2, and PX_3 may have a rectangular shape in a plan view, but the size and the shape of the first, second, and third subpixels PX_1, PX_2, and PX_3 may vary. Alternatively, in a plan view, the first subpixel PX_1 may have a rectangular shape having longer first sides than second sides thereof, the second subpixel PX_2 may have a substantially square shape having first sides and second sides that are substantially as long as the first sides, and the third subpixel PX_3 may have a rectangular shape having second sides that are longer than first sides thereof.

Also, in a plan view, the first subpixel PX_f1 may have a smaller size than the second and third subpixels PX_2 and PX_3, and the second subpixel PX_2 may have a smaller size than the third subpixel PX_3.

The pattern of arrangement, the planar shape, and the planar size of the first, second, and third subpixels PX_1, PX_2, and PX_3 are not particularly limited, but may vary.

Each of the first, second, and third subpixels PX_1, PX_2, and PX_3 may include a bank layer, an emission layer, and a black matrix layer. In a plan view, the bank layer may include an outer bank pattern, which is disposed on the outside of the emission layer, and a bank island pattern, which is located at the center of the emission layer in a plan view, and the black matrix layer may include an outer black matrix pattern, which is located on the outside of the emission layer, and a black matrix island pattern, which is located at the center of the emission layer.

Specifically, the first subpixel PX_1 may include a first emission layer EL_1, a first outer bank pattern BPDL_1, a first bank island pattern BPDL_I_1, a first outer black matrix pattern BM_1, and a first black matrix island pattern BM_I_1, the second subpixel PX_2 may include a second emission layer EL_2, a second outer bank pattern BPDL_2, a second bank island pattern BPDL_I_2, a second outer black matrix pattern BM_2, and a second black matrix island pattern BM_I_2, and the third subpixel PX_3 may include a third emission layer EL_3, a second outer bank pattern BPDL_3, a third bank island pattern BPDL_I_3, a third outer black matrix pattern BM_3, and a third black matrix island pattern BM_I_3.

The first, second, and third outer bank patterns BPDL_1, BPDL_2, and BPDL_3 may be physically spaced apart from the first, second, and third bank island patterns BPDL_I_1, BPDL_I_2, and BPDL_I_3.

The first, second, and third outer black matrix patterns BM_1, BM_2, and BM_3 may be physically spaced apart from the first, second, and third black matrix island patterns BM_I_1, BM_I_2, and BM_I_3.

FIG. 2 illustrates that the first, second, and third subpixels PX_1, PX_2, and PX_3 are defined by the boundaries therebetween. However, actually, the first, second, and third outer bank patterns BPDL_1, BPDL_2, and BPDL_3 of the first, second, and third subpixels PX_1, PX_2, and PX_3 may be physically connected to one another, and the first, second, and third outer black matrix patterns BM_1, BM_2, and BM_3 of the first, second, and third subpixels PX_1, PX_2, and PX_3 may be physically connected to one another.

As described above, the first, second, and third subpixels PX_1, PX_2, and PX_3 may have different shapes and different sizes in a plan view, but the pattern of arrangement of the first, second, and third emission layers EL_1, EL_2, and EL_3, the first, second, and third outer bank patterns BPDL_1, BPDL_2, and BPDL_3, the first, second, and third bank island patterns BPDL_I_1, BPDL_I_2, and BPDL_I_3, the first, second, and third outer black matrix patterns BM_1, BM_2, and BM_3, and the first, second, and third black matrix island patterns BM_I_1, BM_I_2, and BM_I_3 may be substantially uniform.

The pattern of arrangement of the first emission layer EL_1, the first outer bank pattern BPDL_1, the first bank island pattern BPDL_I_1, the first outer black matrix pattern BM_1, and the first black matrix island pattern BM_I_1 will hereinafter be described, but descriptions of the pattern of arrangement of the second emission layer EL_2, the second outer bank pattern BPDL_2, the second bank island pattern BPDL_I_2, the second outer black matrix pattern BM_2, and the second black matrix island pattern BM_I_2 and the pattern of arrangement of the third emission layer EL_3, the third outer bank pattern BPDL_3, the third bank island pattern BPDL_I_3, the third outer black matrix pattern BM_3, and the third black matrix island pattern BM_I_3 will be omitted for ease in explanation of the embodiment.

Figure 3:
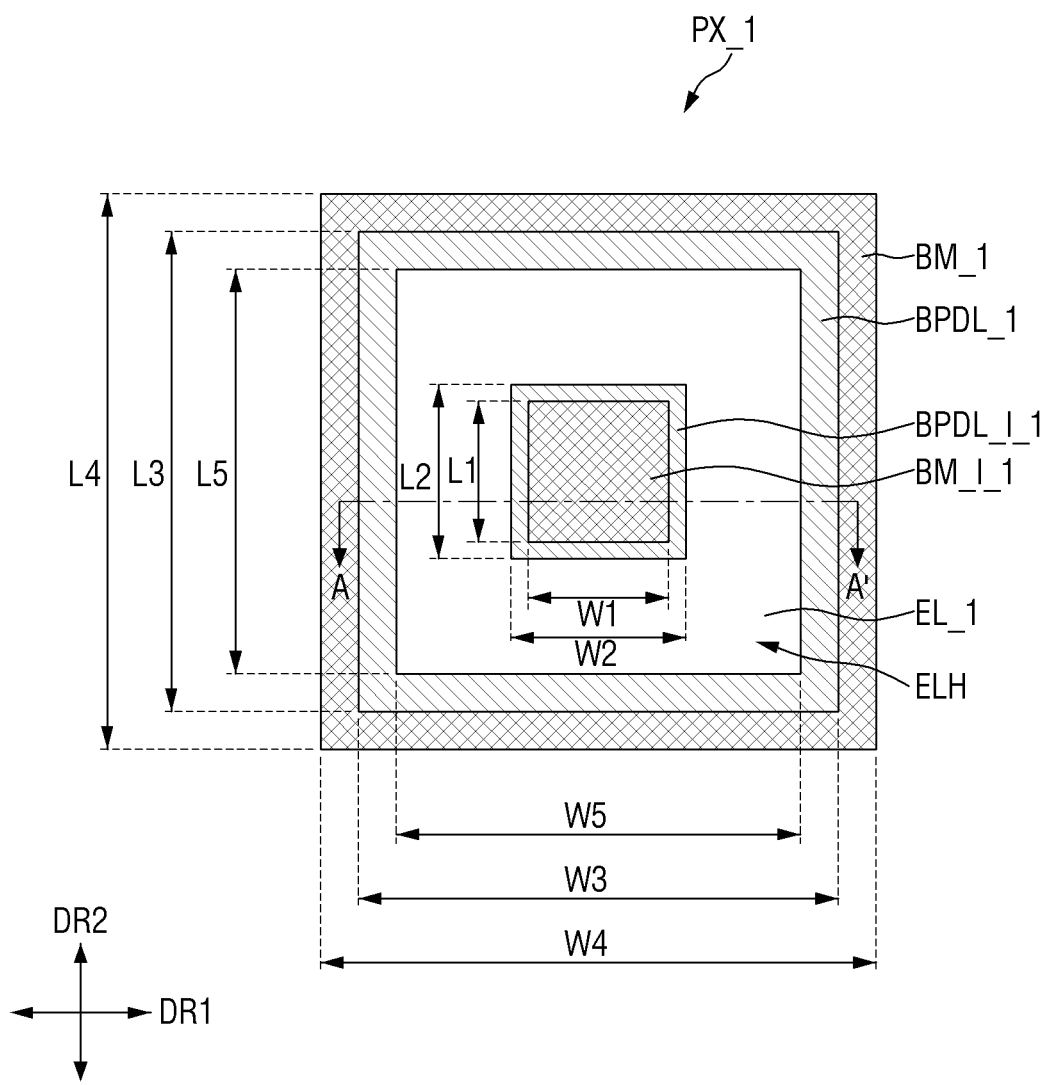
FIG. 3 is an enlarged plan view of a first subpixel of FIG. 2.
Figure 4:
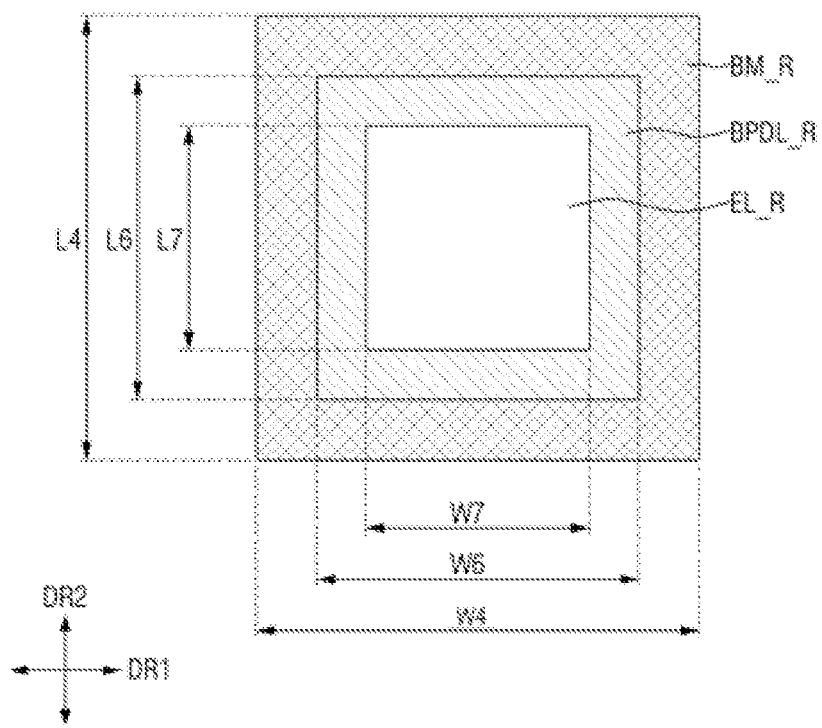
FIG. 4 is an enlarged plan view of a first subpixel of a pixel according to a comparative example.
Figure 5A:
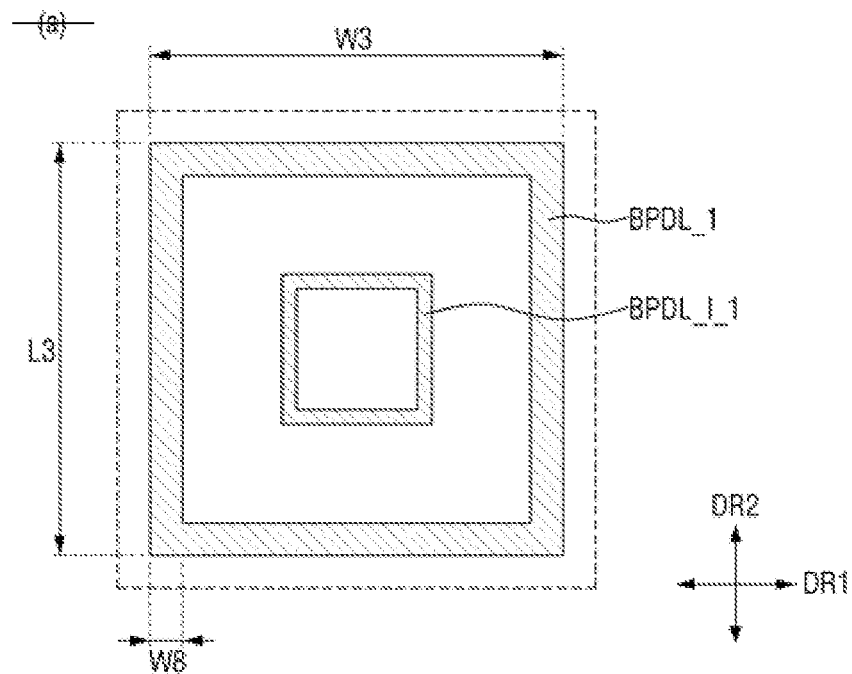
FIG. 5A is a plan view illustrating an exposed outer bank pattern and an exposed bank island pattern of the first subpixel of FIG. 3.
Figure 5B:
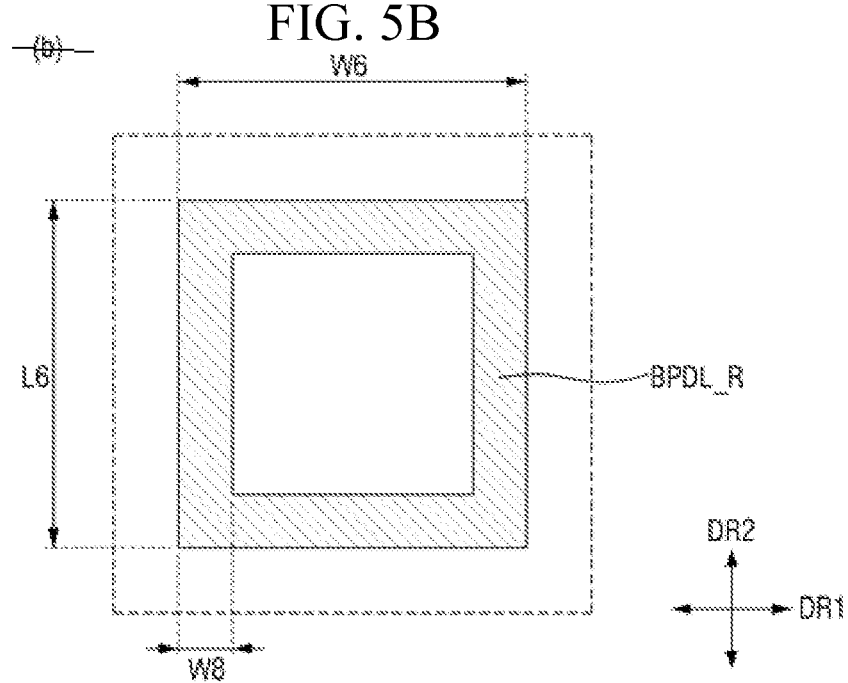
FIG. 5B is a plan view illustrating an exposed outer bank pattern of the first subpixel according to the comparative example of FIG. 4.

FIG. 3 is an enlarged plan view of the first subpixel of FIG. 2. FIG. 4 is an enlarged plan view of a first subpixel of a pixel according to a comparative example. FIG. 5A is a plan view illustrating an exposed outer bank pattern and an exposed bank island pattern of the first subpixel of FIG. 3. FIG. 5B is a plan view illustrating an exposed outer bank pattern of the first subpixel according to the comparative example of FIG. 4.

Referring to FIG. 3, in a plan view, the first emission layer EL_1 of the first subpixel PX_1 may be completely surrounded by the first outer bank pattern BPDL_1 and the first outer black matrix pattern BM_1. An area where the first emission layer EL_1, which is surrounded by the first outer bank pattern BPDL_1, is located may be defined as a first emission area. Similarly, an area where the second emission layer EL_2, which is surrounded by the second outer bank pattern BPDL_2, is located may be defined as a second emission area, and an area where the third emission layer EL_3, which is surrounded by the third outer bank pattern BPDL_3, is located may be defined as a third emission area.

Each of the first outer bank pattern BPDL_1 and the first outer black matrix pattern BM_1 may have a rectangular frame shape. That is, the first emission layer EL_1 may be completely surrounded by the first outer bank pattern BPDL_1 and the first outer black matrix pattern BM_1, which have a rectangular frame shape in a plan view.

The first emission layer EL_1, like the first outer bank pattern BPDL_1, may have a rectangular frame shape in a plan view. The space completely surrounded by the first emission layer EL_1, which has a rectangular frame shape, will hereinafter be defined as an emission hole of the first emission layer EL_1. As will be described later, the emission hole may completely penetrate the first emission layer EL_1 in a thickness direction. That is, the emission hole may be formed in the first emission layer EL_1.

The first bank island pattern BPDL_I_1 and the first black matrix island pattern BM_I_1 may be disposed in the emission hole of the first emission layer EL_1, which has a rectangular frame shape. The first bank island pattern BPDL_I_1 and the first black matrix island pattern BM_I_1 may be completely surrounded by the first emission layer EL_1 in a plan view.

The first outer bank pattern BPDL_1 and the first outer black matrix pattern BM_1 may overlap with each other. The first outer bank pattern BPDL_1 may have a greater size than the first outer black matrix pattern BM_1 in a plan view. That is, the first outer black matrix pattern BM_1 may completely overlap with the first outer bank pattern BPDL_1, and the first outer bank pattern BPDL_1 may protrude beyond the first outer black matrix pattern BM_1 toward the first bank island pattern BPDL_I_1.

The first bank island pattern BPDL_I_1 and the first black matrix island pattern BM_I_1 may overlap with each other. The first bank island pattern BPDL_I_1 may have a larger size than the first black matrix island pattern BM_I_1 in a plan view. That is, the first black matrix island pattern BM_I_1 may completely overlap with the first bank island pattern BPDL_I_1, and the first bank island pattern BPDL_I_1 may protrude beyond the first black matrix island pattern BM_I_1 toward the first outer bank pattern BPDL_1.

In a plan view, the first emission layer EL_1 may have an area of $(W5*L5)-(W2*L2)$, the first outer bank pattern BPDL_1 may have an area of $(W4*L4)-(W5*L5)$, the first outer black matrix pattern BM_1 may have an area of $(W4*L4)-(W3*L3)$, the first outer black matrix pattern BM_1 may have an area of $(W4*L4)-(W3*L3)$, the first bank island pattern BM_I_1 may have an area of $(W2*L2)$, and the first black matrix island pattern BM_I_1 may have an area of $(W1*L1)$. Referring to FIG. 4, in a plan view, an emission layer EL_R of the first subpixel according to a comparative example may have an area of $(W7*L7)$, an outer bank pattern BPDL_R may have an area of $(W4*L4)-(W7*L7)$, and an outer black matrix pattern BM_R may have an area of $(W4*L4)-(W6*L6)$.

Here, the first emission layer EL_1 may have the same size as the emission layer EL_R in a plan view. That is, the aperture of the first subpixel PX_1 may have the same size as the aperture of the first subpixel according to the comparative example of FIG. 4 in a plan view. Accordingly, as the size of the area of the first subpixel PX_1 that actually generates first-color light is the same as the size of the area of the first subpixel according to the comparative example of FIG. 4, the difference in the amount of first-color light generated between the first subpixel PX_1 and the first subpixel according to the comparative example of FIG. 4 may be substantially uniformly maintained.

The area of an exposed part of the bank layer of the first subpixel PX_1 may differ from the area of an exposed part of the bank layer of the first subpixel according to the comparative example of FIG. 4.

That is, referring to FIGS. 3, 4, and 5A, the area of an exposed part of the first outer bank pattern BPDL_1 of the first subpixel PX_1 may be $(W3*L3)-(W5*L5)$, and the area of an exposed part of the first bank island pattern BPDL_I_1 may be $(W2*L2)-(W1*L1)$. That is, the area of the exposed part of the bank layer of the first subpixel PX_1 may be $(W3*L3)-(W5*L5)+(W2*L2)-(W1*L1)$.

The area of an exposed part of the outer bank pattern BPDL_R of the first subpixel according to the comparative example of FIG. 4 may be $(W6*L6)-(W7*L7)$.

As illustrated in FIGS. 5A and 5B, the width of an exposed rectangular frame-shaped part of the first outer bank pattern BPDL_1 of the first subpixel PX_1, i.e., a width W8, may be designed to be the same as the width of an exposed rectangular frame-shaped part of the first outer bank pattern BPDL_R of the first subpixel according to the comparative example of FIG. 4. Accordingly, the white angle difference (WAD) for the first subpixel PX_1 may be maintained to be the same as the WAD of the first subpixel according to the comparative example of FIG. 4. Here, the term "WAD" refers to an evaluation of changes in the white characteristics of white patterns of a display device depending on the angle from which the white patterns are viewed, i.e., luminance and color coordinate change measurements as compared to the front perpendicular to the screen of the display device.

Thus, as the width of a rectangular frame-shaped part of the first subpixel PX_1, i.e., the width W8, is identical to the width of a rectangular frame-shaped part of the first subpixel according to the comparative example of FIG. 4 and the area of the first emission layer EL_1 of the first subpixel PX_1 is the same as the area of the emission layer EL_R of the first subpixel according to the comparative example of FIG. 4, the length of the rectangular frame-shaped part of the first subpixel PX_1, i.e., a length L3, may be greater than the length of the rectangular frame-shaped part of the first subpixel according to the comparative example of FIG. 4, i.e., a length L6.

Accordingly, as the area of the exposed part of the first outer bank pattern BPDL_1 of the first subpixel PX_1 is greater than the area of the exposed part of the outer bank pattern BPDL_R of the first subpixel according to the comparative example of FIG. 4 and the first bank island pattern BPDL_I_1 is further disposed in the first subpixel PX_1, the area of the exposed part of the bank layer of the first subpixel PX_1 may be greater than the area of the exposed part of the bank layer of the first subpixel according to the comparative example of FIG. 4.

Figure 6:
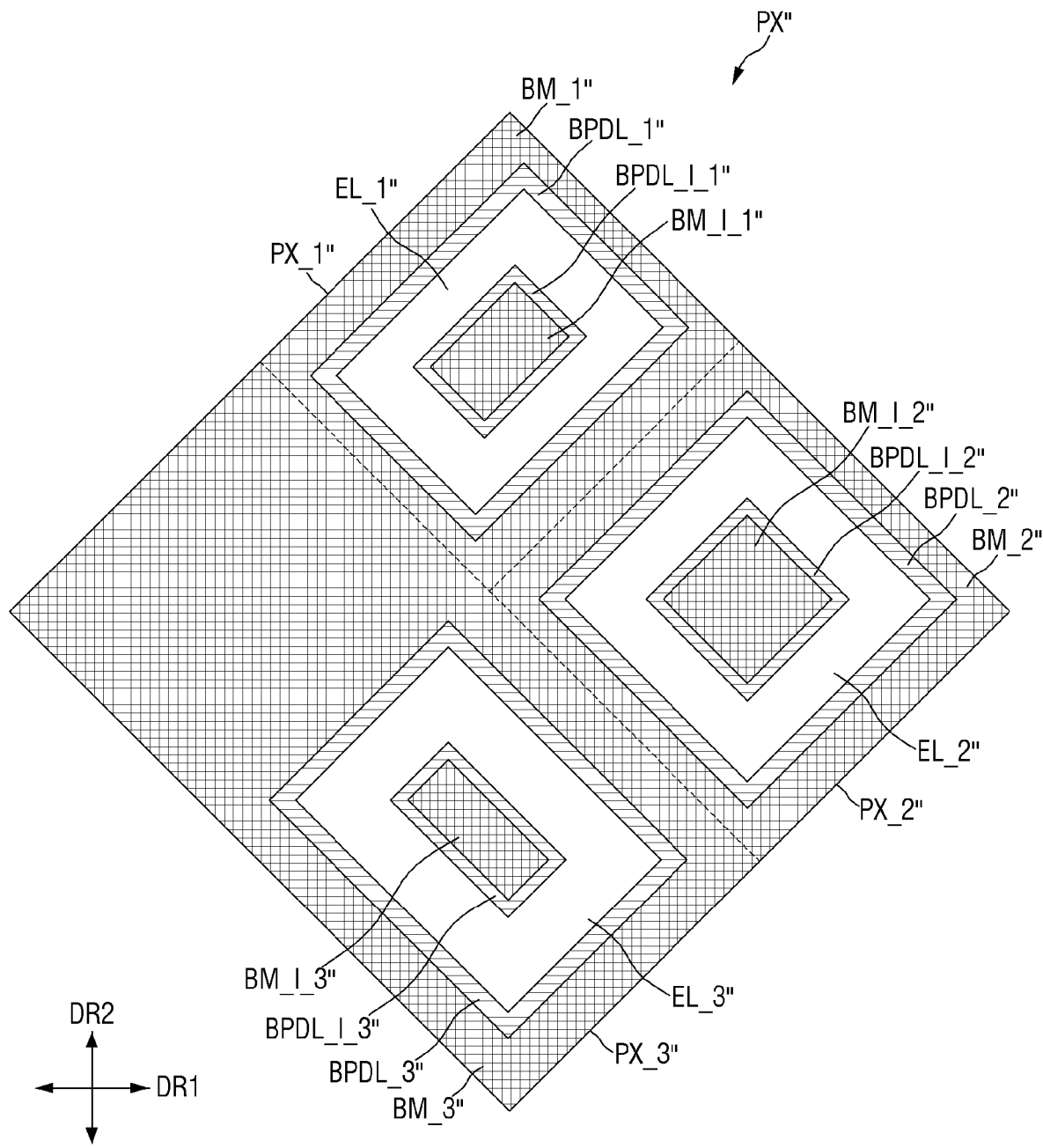
FIG. 6 is a plan view of a pixel of a display device according to another embodiment.
Figure 7:
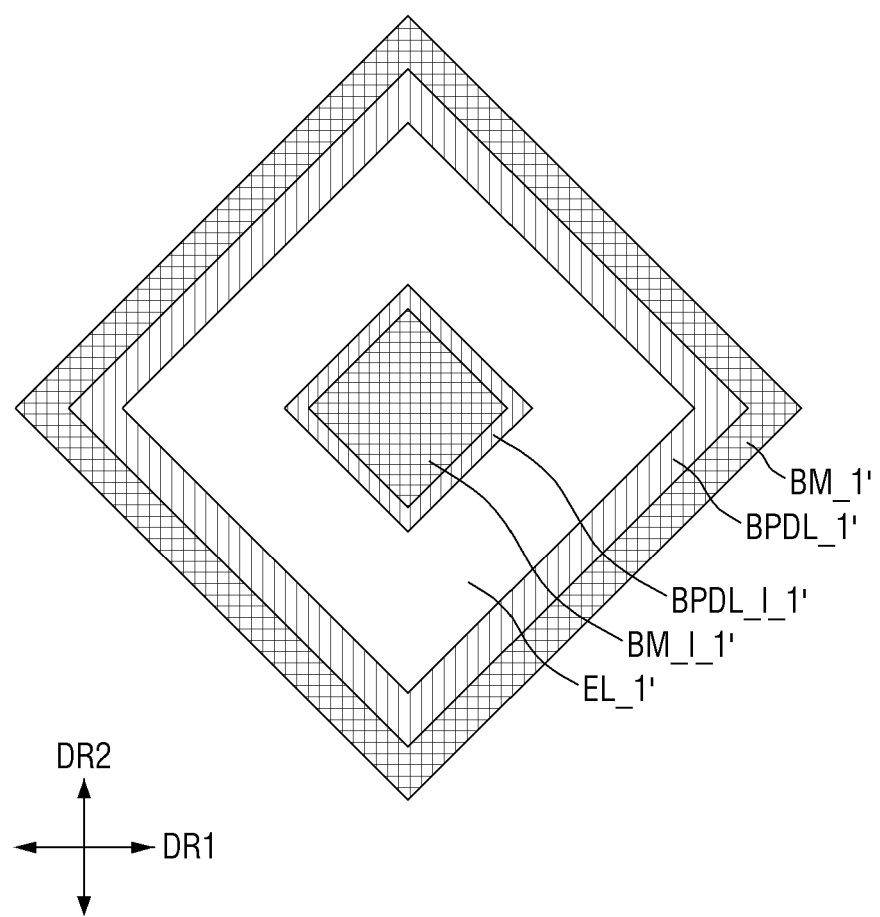
FIG. 7 is an enlarged plan view of a first subpixel of FIG. 6.

FIG. 6 is a plan view of a pixel of a display device according to another embodiment. FIG. 7 is an enlarged plan view of a first subpixel of FIG. 6.

The display device of FIGS. 6 and 7 will hereinafter be described, focusing mainly on the differences with the display device of FIGS. 2 and 3.

Referring to FIGS. 6 and 7, a pixel PX" may have a rhombus or substantially rhombus shape in a plan view. The term "substantially rhombus shape", as used herein, means a shape that appears to the naked eye to be a rhombus, has third sides that extend in a diagonal direction (hereinafter, a third direction) between the first and second directions DR1 and DR2 and fourth sides extending in a fourth direction, which intersects the third direction, and is observed as a rectangle when rotated clockwise or counterclockwise.

The pixel PX" may have third sides extending in the third direction and fourth sides extending in the fourth direction. As illustrated in FIG. 6, the pixel PX" may include a plurality of subpixels, i.e., first, second, and third subpixels PX_1", PX_2", and PX_3".

The first subpixel PX_1" may be disposed adjacent to a fourth side of the pixel PX" on the upper left side of the pixel PX" and to a third side of the pixel PX" on the upper right side of the pixel PX", the second subpixel PX_2" may be disposed adjacent to a fourth side of the PX_2" on the lower right side of the PX_2" and to the third side of the pixel PX" on the upper right side of the pixel PX", and the third subpixel PX_3" may be disposed adjacent to a third side of the pixel PX" on the lower left side of the pixel PX" and to a fourth side of the pixel PX" on the lower right side of the pixel PX".

Each of the first, second, and third subpixels PX_1", PX_2", and PX_3" may include a bank layer, an emission layer, and a black matrix layer. In a plan view, the bank layer may include an outer bank pattern, which is disposed on the outside of the emission layer, and a bank island pattern, which is located at the centers of the emission layer in a plan view, and the black matrix layer may include an outer black matrix pattern, which is located on the outside of the emission layer, and a black matrix island pattern, which is located at the center of the emission layer.

Specifically, the first subpixel PX_1" may include a first emission layer EL_1", a first outer bank pattern BPDL_1", a first bank island pattern BPDL_I_1", a first outer black matrix pattern BM_1", and a first black matrix island pattern BM_I_1", the second subpixel PX_2" may include a second emission layer EL 2", a second outer bank pattern BPDL_2", a second bank island pattern BPDL_I_2", a second outer black matrix pattern BM_2", and a second black matrix island pattern BM_I_2", and the third subpixel PX_3" may include a third emission layer EL_3", a second outer bank pattern BPDL_3", a third bank island pattern BPDL_I_3", a third outer black matrix pattern BM_3", and a third black matrix island pattern BM_I_3".

Figure 8:
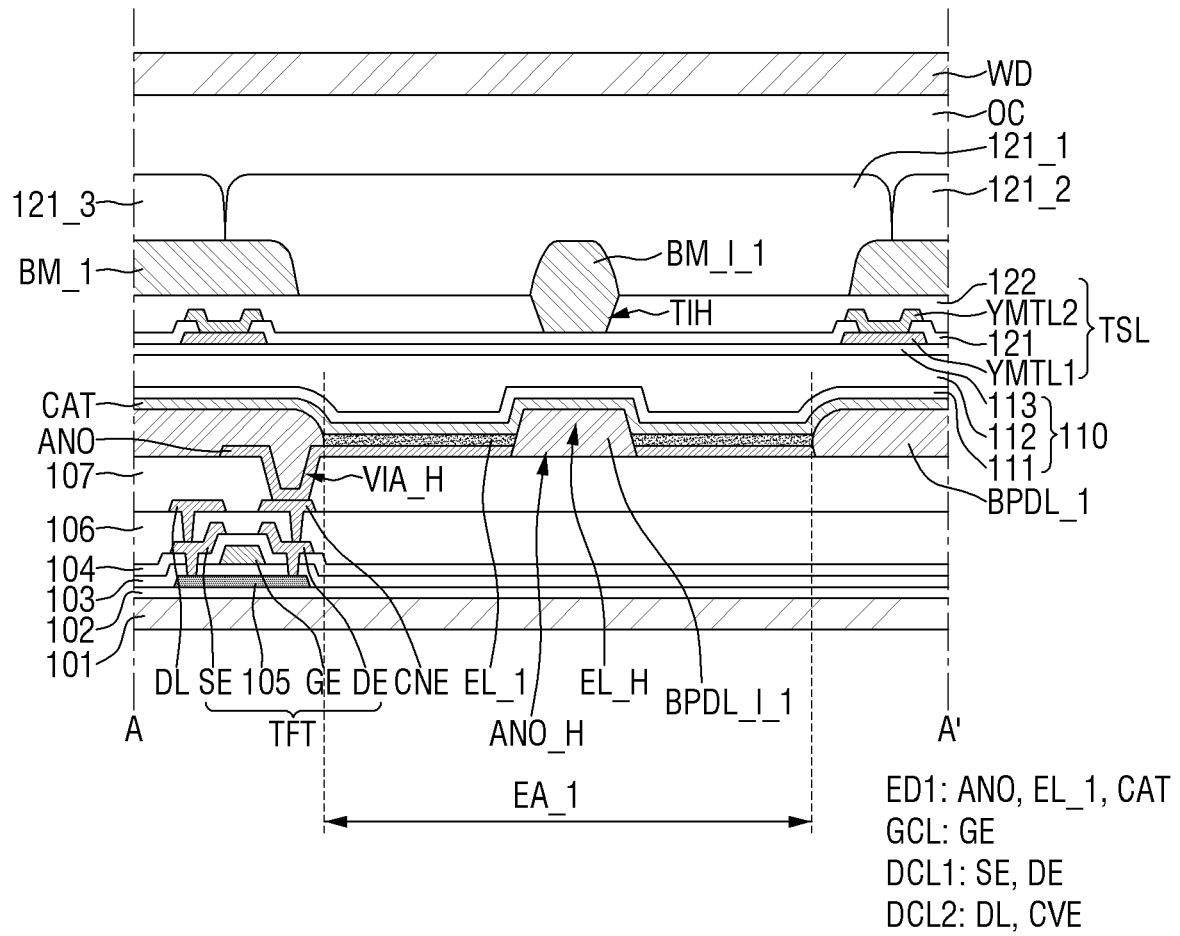
FIG. 8 is a cross-sectional view of the first subpixel of FIG. 3.

FIG. 8 is a cross-sectional view of the first subpixel of FIG. 3. For convenience, FIG. 3 illustrates only the first outer black matrix pattern BM_1, the first outer bank pattern BPDL_1, the first bank island pattern BPDL_I_1, the first black matrix island pattern BM_I_1, and the first emission layer EL_1, and FIG. 8 illustrates how other layers of the first subpixel PX_1 than the first outer black matrix pattern BM_1, the first outer bank pattern BPDL_1, the first bank island pattern BPDL_I_1, the first black matrix island pattern BM_I_1, and the first emission layer EL_1 are stacked. The structure of the first subpixel PX_1 will hereinafter be described in further detail with reference to FIG. 8.

Referring to FIG. 8, the first subpixel PX_1 may include a base substrate 101, a buffer layer 102, an active pattern 105, a first gate insulating layer 103, a first gate conductive layer GCL, which includes a gate electrode GE, a second gate insulating layer 104, a first data conductive layer DCL1, which includes a source electrode SE and a drain electrode DE, a first insulating layer 106, a second data conductive layer DCL2, which includes a data line DL and a contact pad CVE, a second insulating layer 107, the bank layer, which includes the first outer bank pattern BPDL_1 and the first bank island pattern BPDL_I_1, a first light-emitting element ED1, a thin-film encapsulation layer 110, a touch sensor layer TSL, the black matrix layer, which includes the first outer black matrix pattern BM_1 and the first black matrix island pattern BM_I_1, a color filter layer, a height difference compensation layer OC, and a window WD. The active pattern 105, the gate electrode GE, the source electrode SE, and the drain electrode DE may form a thin-film transistor TFT.

The first light-emitting element ED1 may include a first electrode ANO, a second electrode CAT, which faces the first electrode ANO, and a first emission layer EL_1, which is disposed between the first and second electrodes ANO and CAT.

The base substrate 101 may include a transparent insulating substrate. In one example, the base substrate 101 may be a transparent resin substrate having flexibility. The transparent resin substrate may include a polyimide (PI)-based resin, an acrylic-based resin, a polyacrylate-based resin, a polycarbonate-based resin, a polyether-based resin, a sulfonic acid-based resin, or a polyethylene terephthalate-based resin. Preferably, the base substrate 101 may be a PI resin film.

The buffer layer 102 may prevent the diffusion of metal atoms or impurities from the base substrate 101 and may control the speed of transmission of heat during a crystallization process for forming the active pattern 105 so that the active pattern 105 may be substantially uniformly acquired. Also, in a case where the surface of the base substrate 101 is uneven, the buffer layer 102 may improve the flatness of the surface of the base substrate 101. The buffer layer 102 may be formed of a silicon compound such as silicon oxide ($SiO_x$), silicon nitride ($SiN_x$), silicon oxynitride ($SiO_x N_y$), silicon oxycarbide ($SiO_x C_y$), or silicon carbonitride ($SiC_x N_y$).

The active pattern 105 of the thin-film transistor TFT may include drain and source regions doped with large amounts of impurities and a channel region between the drain and source regions.

The first gate insulating layer 103 may be disposed on the buffer layer 102 where the active pattern 105 is disposed. The first gate insulating layer 103 may include a silicon compound or a metal oxide.

The first gate conductive layer GCL may be disposed on the gate insulating layer 120. The first gate conductive layer GCL may include the gate electrode GE of the thin-film transistor TFT and a signal line (such as a gate line) that transmits a signal for driving the pixel PX. The first gate conductive layer GCL may be formed of a metal, an alloy, a metal nitride, a conductive metal oxide, or a transparent conductive material. In one example, the first gate conductive layer GCL may be formed of a metal such as copper, aluminum, or molybdenum. The first gate conductive layer GCL may have a multilayer structure. In one example, the first gate conductive layer GCL may include a copper layer and a molybdenum layer on the copper layer.

The second gate insulating layer 104 may be disposed on the first gate conductive layer GCL. The second gate insulating layer 104 may be formed of a silicon compound such as $SiO_x$, $SiN_x$, $SiO_x N_y$, $SiO_x C_y$, or $SiC_x N_y$.

A second gate conductive layer may be further disposed on the second gate insulating layer 104. The second gate conductive layer may be formed of a metal, an alloy, a metal nitride, a conductive metal oxide, or a transparent conductive material. In one example, the second gate conductive layer may be formed of a metal such as copper, aluminum, or molybdenum. The second gate conductive layer may have a multilayer structure. In one example, the second gate conductive layer may include a copper layer and a molybdenum layer on the copper layer.

The first data conductive layer DCL1 may be disposed on the second gate insulating layer 104. The first data conductive layer DCL1 may include the source electrode SE and the drain electrode DE.

The source electrode SE may be connected to a source region S2 through a contact hole that penetrates the second gate insulating layer 104 and the first gate insulating layer 103, and the drain electrode DE may be connected to a drain region D2 through a contact hole that penetrates the second gate insulating layer 104 and the first gate insulating layer 103.

The first data conductive layer DCL1 may be formed of a metal, an alloy, a metal nitride, a conductive metal oxide, or a transparent conductive material. In one example, the first data conductive layer DCL1 may be formed of a metal with excellent conductivity such as copper or aluminum. The first data conductive layer DCL1 may have a multilayer structure. In one example, the first data conductive layer DCL1 may include a titanium layer, an aluminum layer on the titanium layer, and another titanium layer on the aluminum layer.

The first insulating layer 106 may be disposed on the second gate insulating layer 104 where the first data conductive layer DCL1 is disposed. The first insulating layer 106 may include an organic insulating material and may have a substantially flat top surface while sufficiently covering the first data conductive layer DCL1.

The second data conductive layer DCL2 may be disposed on the first insulating layer 106. The second data conductive layer DCL2 may include the data line DL and the contact pad CVE. The second data conductive layer DCL2 may be formed of a metal, an alloy, a metal nitride, a conductive metal oxide, or a transparent conductive material.

The second insulating layer 107 may be disposed on the first insulating layer 106 where the second data conductive layer DCL2 is disposed. The second insulating layer 107 may include an organic insulating material and may have a substantially flat top surface while sufficiently covering the second data conductive layer DCL2.

The first electrode ANO may be disposed on the second insulating layer 107. The first electrode ANO may be electrically connected to the thin-film transistor TFT through a via hole VIA_H, which is formed in the second insulating layer 107. In one example, the first electrode ANO may be connected to the drain electrode DE through the contact pad CVE.

The first electrode ANO may be formed of a reflective material or a light-transmitting material depending on how the display device emits light. In one example, the first electrode ANO may include aluminum, an alloy containing aluminum, aluminum nitride, silver, an alloy containing silver, zinc oxide, indium tin oxide, tin oxide, indium oxide, gallium oxide, or indium zinc oxide, and these materials may be used alone or in combination with one another. In one example, the first electrode ANO may have a single-layer or multilayer structure including a metal layer, an alloy layer, a metal nitride layer, a conductive metal oxide layer, and/or a transparent conductive material layer.

An electrode hole ANO_H may be formed in the first electrode ANO in a thickness direction.

Figure 9:
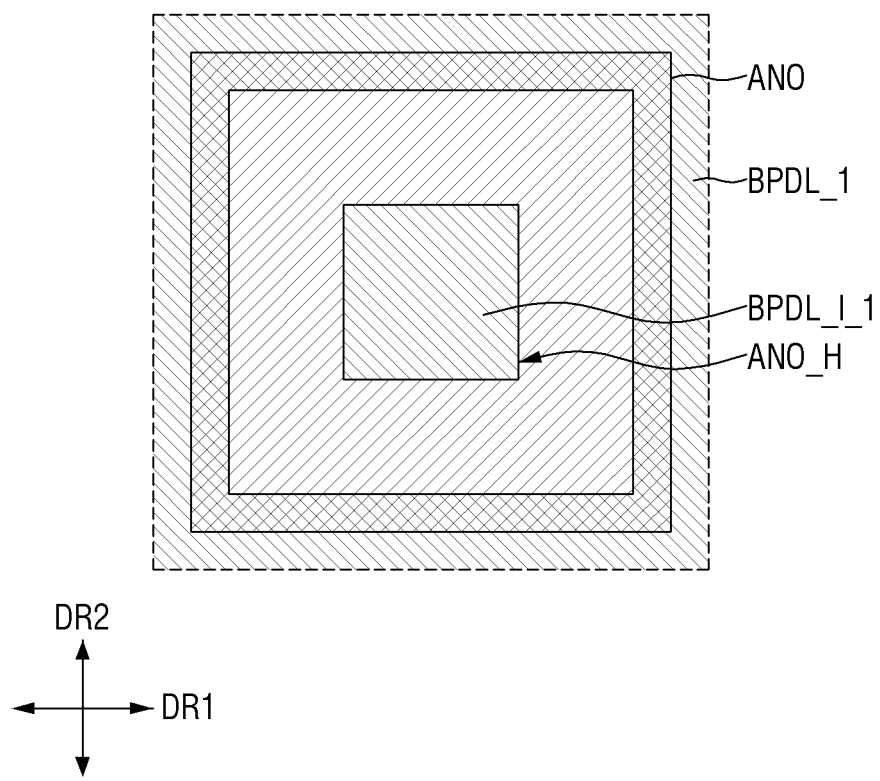
FIG. 9 is a plan view illustrating the relationship between a first electrode and a bank layer of the first subpixel of FIG. 3.

FIG. 9 is a plan view illustrating the relationship between the first electrode of the first subpixel of FIG. 3 and the bank layer.

Referring to FIG. 9, in a plan view, the electrode hole ANO_H may be completely surrounded by the first electrode ANO, and the first bank island pattern BPDL_I_1 may be completely surrounded by the first electrode ANO. FIG. 9 illustrates that the first bank island pattern BPDL_I_1 does not completely overlap with the first electrode ANO, but the embodiment described herein is not limited thereto. Alternatively, the edges of the first electrode ANO may overlap in part with the first bank island pattern BPDL_I_1.

The bank layer may be disposed on the second insulating layer 107 where the first electrode ANO is disposed. The bank layer may be formed of an organic material or an inorganic material. In one example, the bank layer may be formed of photoresist, a polyacrylic-based resin, a PI-based resin, an acrylic-based resin, or a silicon compound. In one example, an opening, which exposes part of the first electrode ANO, may be formed by etching the bank layer.

The bank layer may include the first outer bank pattern BPDL_1, which overlaps with the via hole VIA_H in the thickness direction, and the first bank island pattern BPDL_I_1, which is disposed in the electrode hole ANO_H. The first outer bank pattern BPDL_1 and the first bank island pattern BPDL_I_1 may be formed of the same material by the same process.

The first emission layer EL_1 may be disposed on the first electrode ANO, which is exposed through the openings of the first outer bank pattern BPDL_1 and the first bank island pattern BPDL_I_1. The emission hole EL_H, which penetrates the first emission layer EL_1 in the thickness direction, may be formed in the first emission layer EL_1. In a plan view, the emission hole EL_H may be completely surrounded by the first emission layer EL_1.

The emission hole EL_H may overlap with the electrode hole ANO_H in the thickness direction. The first emission layer EL_1 may be in contact with the first outer bank pattern BPDL_1 and the first bank island pattern BPDL_I_1.

In one example, the first emission layer EL_1 may have a multilayer structure including an organic light-emitting layer, a hole injection layer, a hole transport layer, an electron transport layer, and an electron injection layer. In another example, all the layers of the first emission layer EL_1 except for the organic light-emitting layer may be formed in common to correspond to all subpixels. The organic light-emitting layer of the first emission layer EL_1 may be formed of a light-emitting material capable of generating red light.

The second electrode CAT may be disposed on the bank layer and the first emission layer EL_1. The second electrode CAT may include a light-transmitting material or a reflective material depending on how the display device emits light. In one example, the second electrode CAT may include aluminum, an alloy containing aluminum, aluminum nitride, silver, an alloy containing silver, tungsten, tungsten nitride, copper, an alloy containing copper, nickel, chromium, chromium nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, or indium zinc oxide, and these materials may be used alone or in combination with one another. In one example, the second electrode CAT2 may have a single-layer or multilayer structure including a metal layer, an alloy layer, a metal nitride layer, a conductive metal oxide layer, and/or a transparent conductive material layer.

The second electrode CAT may be in direct contact with the top surfaces of the first outer bank pattern BPDL_1 and the first bank island pattern BPDL_I_1.

The thin-film encapsulation layer 110 may be disposed on the second electrode CAT. The Thin-film encapsulation layer 110 may prevent the penetration of moisture and oxygen from the outside. The thin-film encapsulation layer 110 may include at least one organic layer 112 and one or more inorganic layers 111 and 113. The organic layer 112 may and the inorganic layers 111 and 113 may be alternately stacked. In one example, the thin film encapsulation layer 110 may include two inorganic layers 111 and 113 and one organic layer 112 between the two inorganic layers 111 and 113, but the embodiment described herein is not limited thereto. Alternatively, an encapsulation substrate for preventing the infiltration of an outside air and moisture into the display device may be provided instead of the thin film encapsulation layer 110.

The touch sensor layer TSL may include a first touch conductive layer YMTL1, a first touch insulating layer 121, which is disposed on the first touch conductive layer YMTL1, a second touch conductive layer YMTL2, which is disposed on the first touch insulating layer 121, and a second touch insulating layer 122, which is disposed on the second touch conductive layer YMTL2.

The first touch conductive layer YMTL1 may be disposed on the thin-film encapsulation layer 110. The first touch conductive layer YMTL1 may include first sensing electrodes, which are also disposed in the second touch conductive layer YMTL2 and are adjacent to one another, and first touch bridge electrodes, which electrically connect the first sensing electrodes.

The first touch bridge electrodes of the first touch conductive layer YMTL1 may overlap with the black matrix layer and the bank layer in the thickness direction. As a result, the first touch bridge electrodes of the first touch conductive layer YMTL1 can be prevented from becoming visible to a user.

The first touch insulating layer 121 may be disposed on the first touch conductive layer YMTL1. The first touch insulating layer 121 may insulate the first and second touch conductive layers YMTL1 and YMTL2 from each other.

In one example, the first touch insulating layer 121 may include an inorganic material. The inorganic material may include at least one selected from the group consisting of SiOx, SiNx, and SiOxNy. In another example, the first touch insulating layer 121 may include an organic material. The organic material may include at least one of an acrylic-based resin, a methacrylic-based resin, polyisoprene, a vinyl-based resin, an epoxy-based resin, a urethane-based resin, a cellulose-based resin, a siloxane-based resin, a PI-based resin, a polyamide-based resin, and a perylene-based resin.

The second touch conductive layer YMTL2 may be disposed on the first touch insulating layer 121. The second touch conductive layer YMTL2 may include first sensing electrodes, which are connected to first touch bridge electrodes, second sensing electrodes, and second touch bridge electrodes, which connect adjacent second sensing electrodes.

As illustrated in FIG. 8, the first sensing electrodes may be connected to the first touch bridge electrodes through contact holes that penetrate the first touch insulating layer 121 in the thickness direction.

The first and second touch conductive layers YMTL1 and YMTL2 may be formed as opaque electrodes, but the embodiment described herein is not limited thereto. Alternatively, one of the first and second touch conductive layers YMTL1 and YMTL2 may be formed as an opaque electrode, and the other touch conductive layer may be formed as a transparent electrode. Yet alternatively, the first and second touch conductive layers YMTL1 and YMTL2 may both be formed as transparent electrodes.

The second touch insulating layer 122 may be disposed on the second touch conductive layer YMTL2. The second touch insulating layer 122 may include an organic insulating material. The organic insulating material may be an acrylic-based resin, an epoxy resin, a phenolic resin, a polyamide-based resin, a PI-based resin, an unsaturated polyester resin, a polyphenylene-based resin, a polyphenylene sulfide resin, or benzocyclobutene (BCB).

A touch insulating hole, which penetrates the second touch insulating layer 122 in the thickness direction, may be formed in the second touch insulating layer 122.

The touch insulating hole may overlap with the first bank island pattern BPDL_I_1.

The black matrix layer may be disposed on the second touch insulating layer 122.

The black matrix layer may include the first outer black matrix pattern BM_1, which overlaps with the first outer bank pattern BPDL_1, and the first black matrix island pattern BM_I_1, which is disposed in the touch insulating hole. The first outer black matrix pattern BM_1 may overlap with the via hole VIA_H, but the embodiment described herein is not limited thereto. In a plan view, the first black matrix island pattern BM_I_1 may be completely surrounded by the second touch insulating layer 122.

The first outer black matrix pattern BM_1 and the first black matrix island pattern BM_I_1 may be formed of the same material by the same process.

The color filter layer may be disposed on the second touch insulating layer 122 where the black matrix layer is disposed. The color filter layer may include first, second, and third color filters 121_1, 121_2, and 121_3.

The first color filter 121_1 may selectively transmit red light therethrough. The second color filter 121_2 may selectively transmit green light therethrough. The third color filter 121_3 may selectively transmit blue light therethrough.

The first, second, and third color filters 121_1, 121_2, and 121_3 may be disposed in the first, second, and third subpixels PX_1, PX_2, and PX_3, respectively, of FIG. 2. As the first, second, and third color filters 121_1, 121_2, and 121_3, which are of the same colors as the first, second, and third emission layers EL_1, EL_2, and EL_3, respectively, of FIG. 2, are disposed on the first, second, and third emission layers EL_1, EL_2, and EL_3, respectively, color mixing can be prevented in the pixel PX, and color reproducibility can be improved. Also, as the first, second, and third color filters 121_1, 121_2, and 121_3 absorb a considerable amount of external light, the reflection of external light can be reduced without the need to additionally provide a polarizing plate.

The height difference compensation layer OC may be disposed on the color filter layer. The height difference compensation layer OC may include an organic insulating layer having a planarization function to compensate for any height differences formed by the first, second, and third color filters 121_1, 121_2, and 121_3.

The window WD may be disposed on the height difference compensation layer OC.

It will hereinafter be described how the display device can reduce the reflection of external light with reference to FIGS. 10 through 15.

Figure 10:
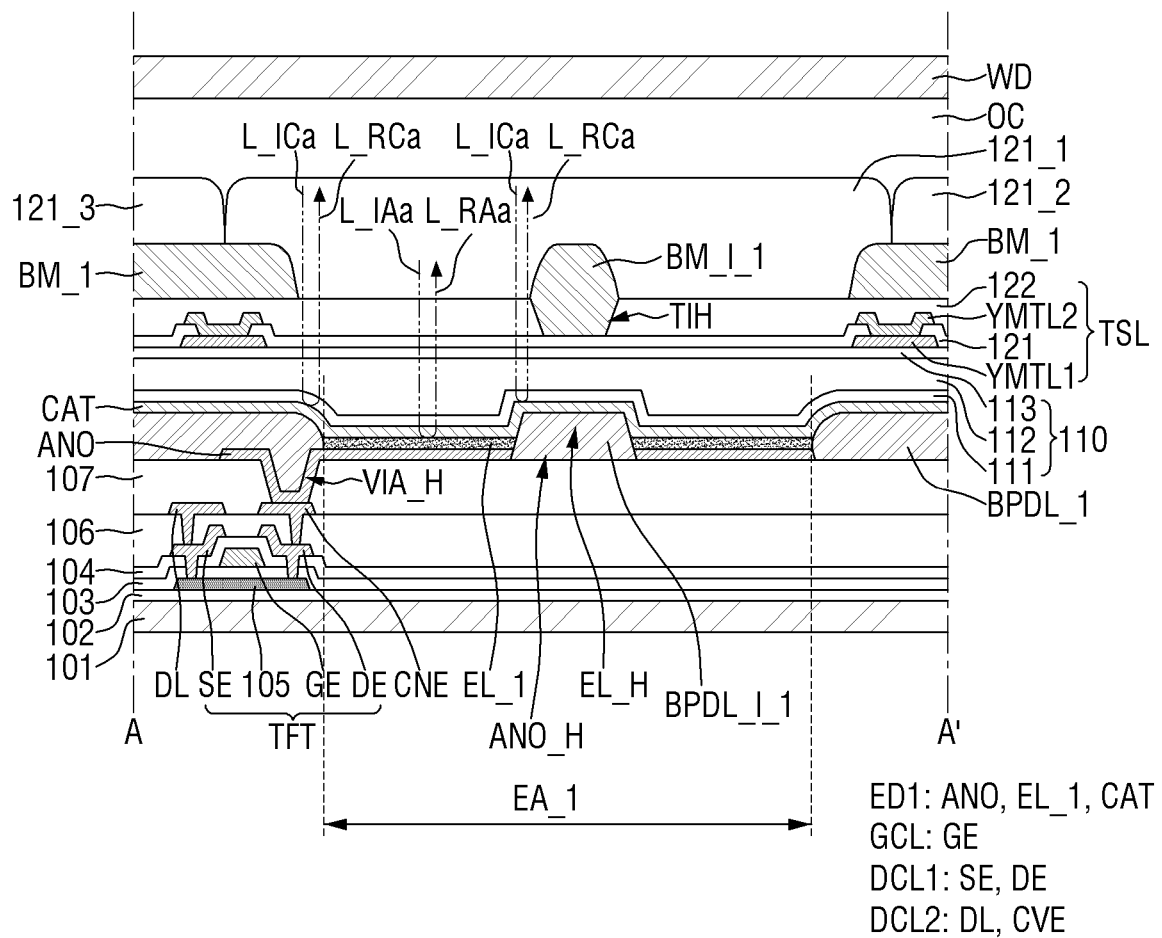
FIG. 10 is a cross-sectional view illustrating light vertically incident upon the second electrode of FIG. 8 and light vertically reflected from the second electrode of FIG. 8.
Figure 11A:
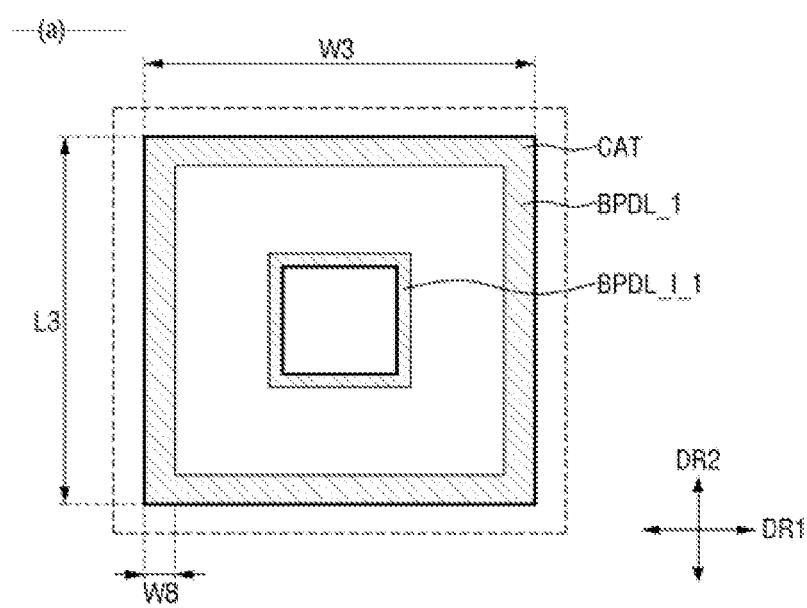
FIG. 11A is a plan view illustrating the relationship between the second electrode and the bank layer of the first subpixel of FIG. 3.
Figure 11B:
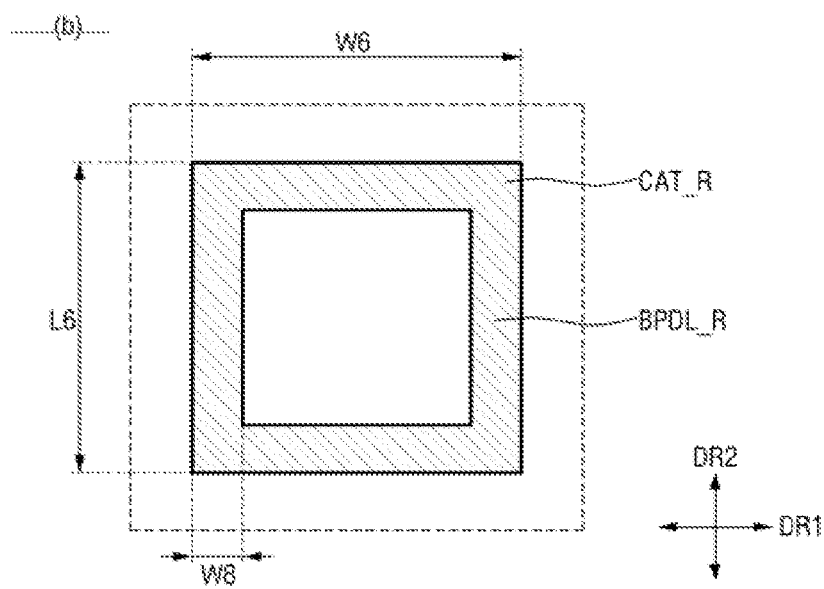
FIG. 11B is a plan view illustrating the relationship between the second electrode and the outer bank pattern of the first subpixel according to the comparative example of FIG. 4.
Figure 12:
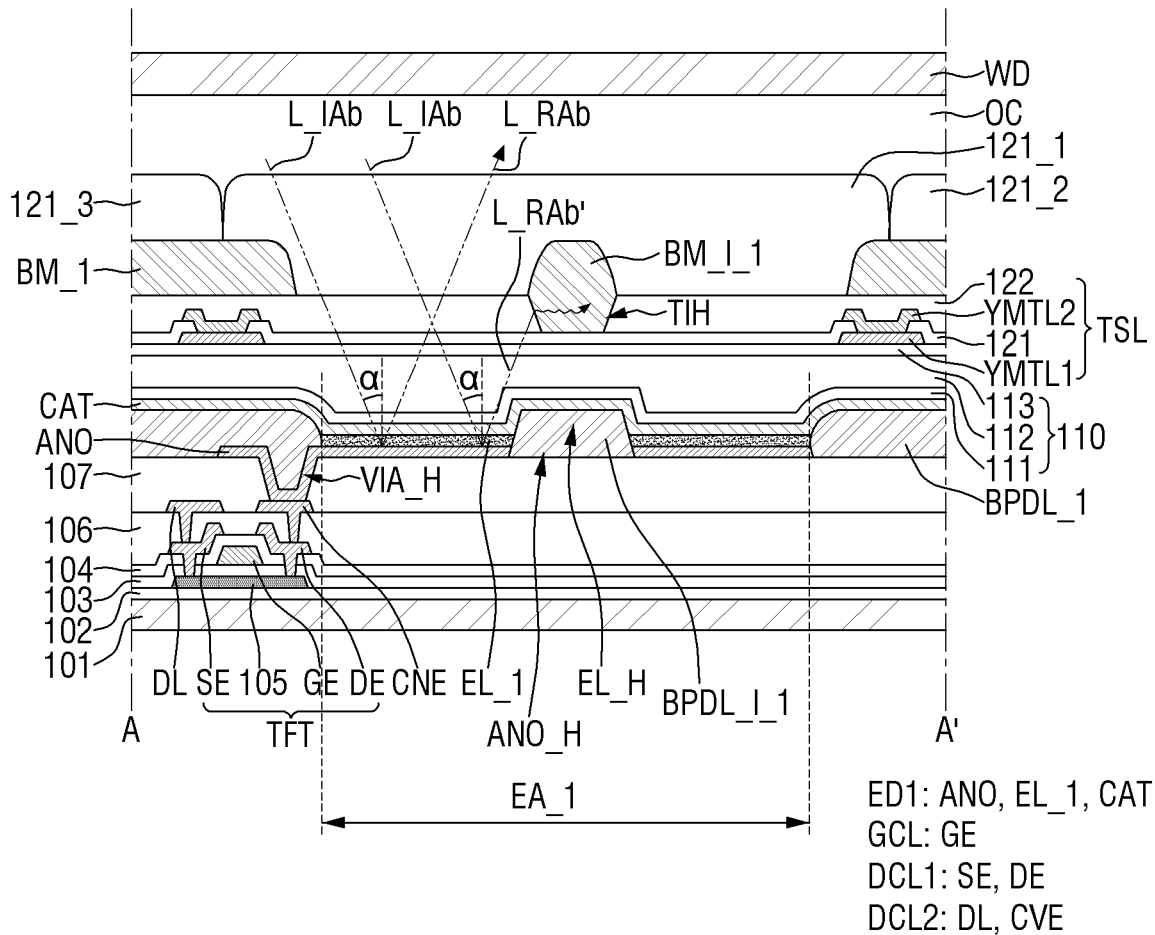
FIG. 12 is a cross-sectional view illustrating light incident diagonally upon the first electrode of FIG. 8 and light reflected diagonally from the first electrode of FIG. 8.
Figure 13:
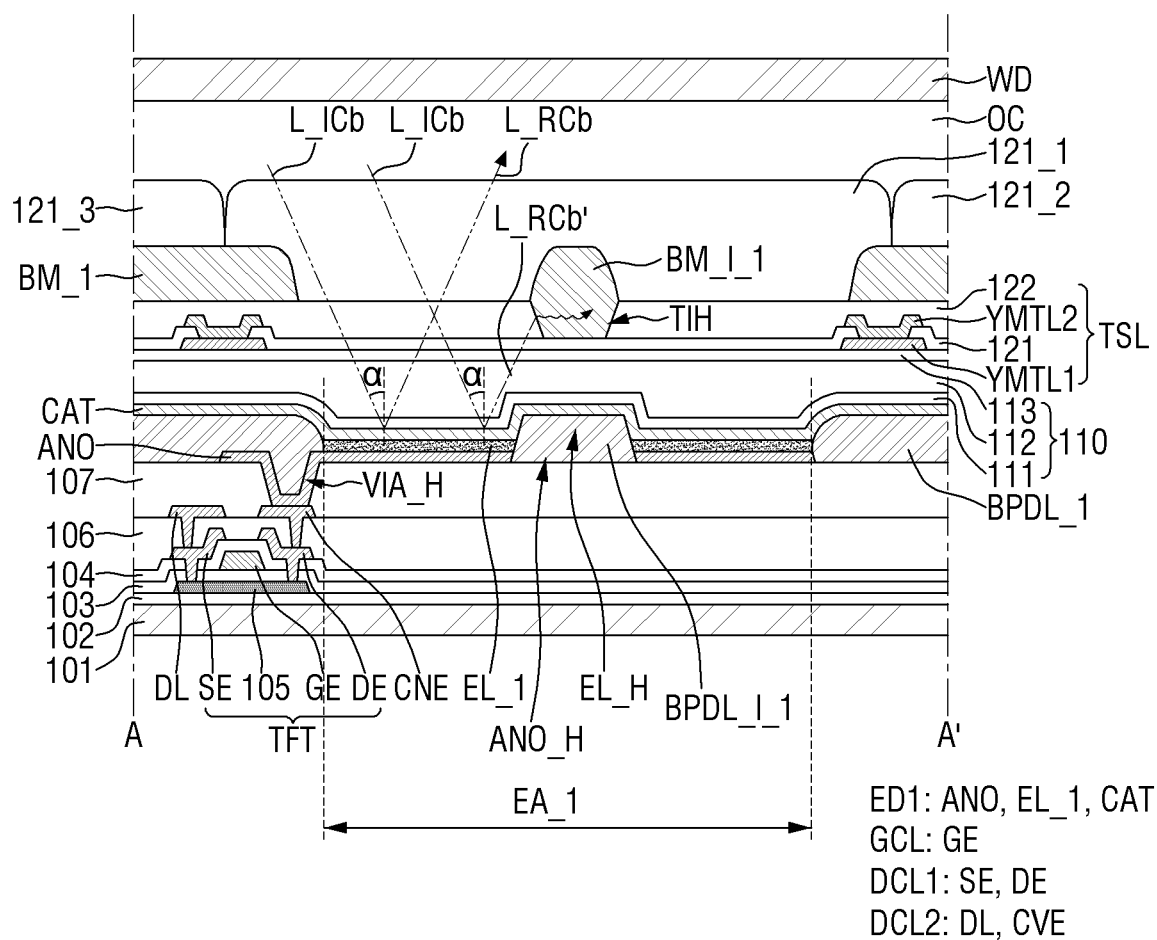
FIG. 13 is a cross-sectional view illustrating light incident diagonally upon the second electrode of FIG. 8 and light reflected diagonally from the second electrode of FIG. 8.
Figure 14:
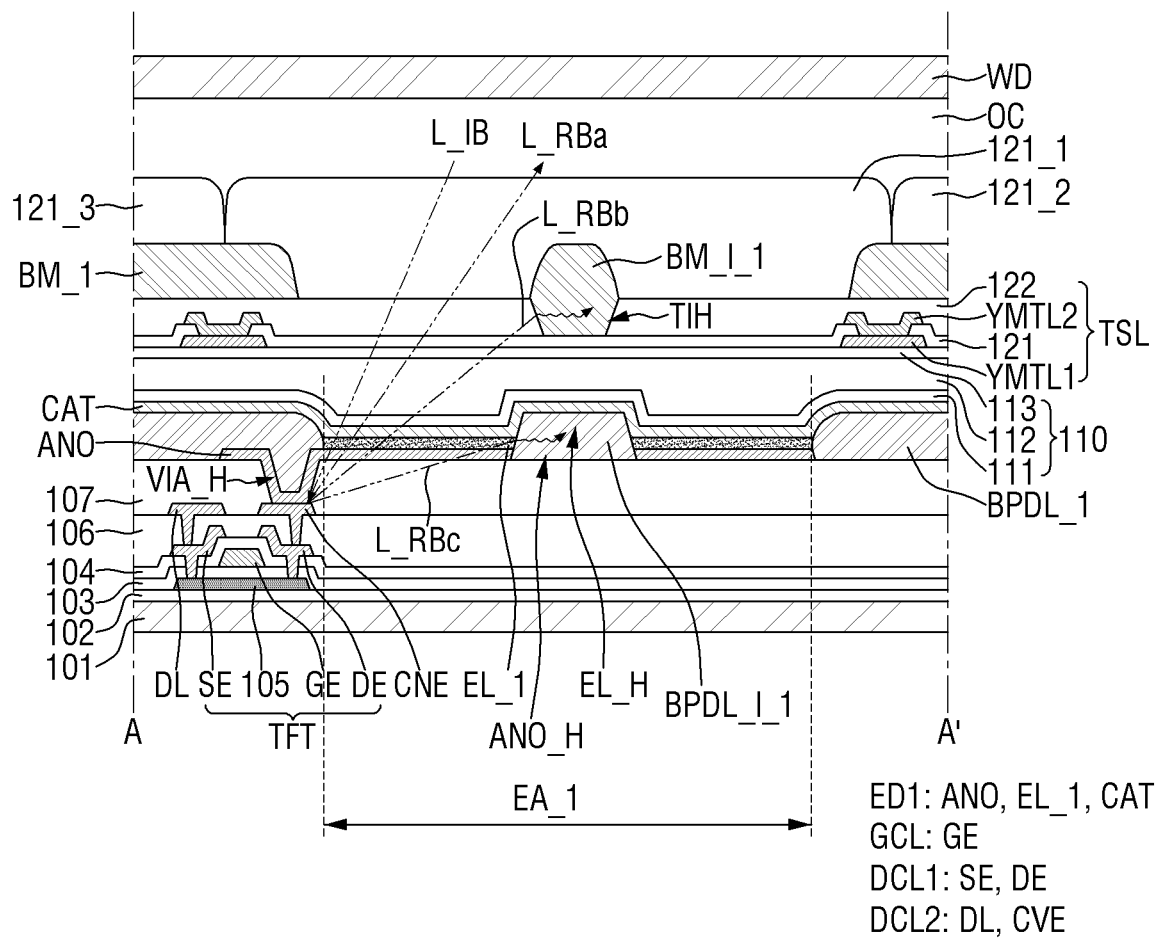
FIG. 14 is a cross-sectional view illustrating light diagonally incident upon the lower electrode of the first electrode of FIG. 8 and light diagonally reflected from the lower electrode of the first electrode of FIG. 8.
Figure 15:
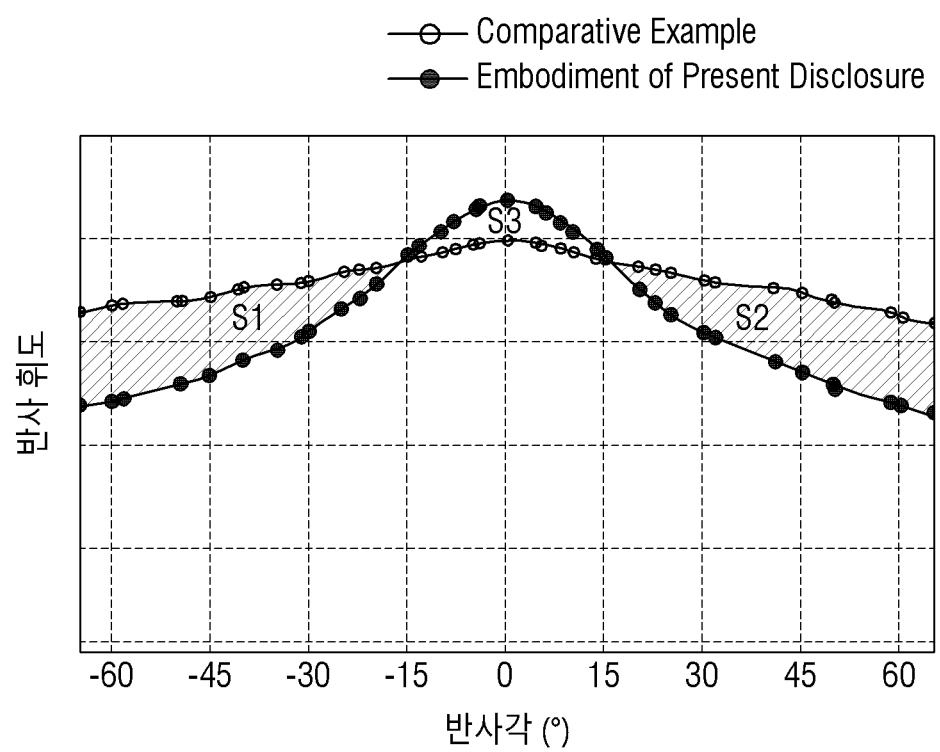
FIG. 15 is a graph comparing the reflective luminance of the display device for external light with the reflective luminance of a display device according to a comparative example for external light.

FIG. 10 is a cross-sectional view illustrating light vertically incident upon the second electrode of FIG. 8 and light vertically reflected from the second electrode of FIG. 8. FIG. 11A is a plan view illustrating the relationship between the second electrode and the bank layer of the first subpixel of FIG. 3. FIG. 11B is a plan view illustrating the relationship between the second electrode and the outer bank pattern of the first subpixel according to the comparative example of FIG. 4. FIG. 12 is a cross-sectional view illustrating light incident diagonally upon the first electrode of FIG. 8 and light reflected diagonally from the first electrode of FIG. 8. FIG. 13 is a cross-sectional view illustrating light incident diagonally upon the second electrode of FIG. 8 and light reflected diagonally from the second electrode of FIG. 8. FIG. 14 is a cross-sectional view illustrating light diagonally incident upon the lower electrode of the first electrode of FIG. 8 and light diagonally reflected from the lower electrode of the first electrode of FIG. 8. FIG. 15 is a graph comparing the reflective luminance of the display device for external light with the reflective luminance of a display device according to a comparative example for external light.

FIG. 10 illustrates vertical incident light and vertical reflected light. Referring to FIG. 10, the vertical incident light may include vertical incident light L_ICa, which is vertically incident upon the second electrode CAT, vertical incident light L_IAa, which is vertically incident upon the first electrode ANO, and the vertical reflected light may include vertical reflected light L_RCa, which is vertically reflected from the second electrode CAT, and vertical reflected light L_RAa, which is vertically reflected from the first electrode ANO.

As the area of part of the bank layer of the first subpixel PX_1, exposed by the black matrix layer, is greater than the area of the exposed part of the bank layer of the first subpixel according to a comparative example, as already mentioned above with reference to FIGS. 3 through 5, the area of part of the second electrode CAT, exposed by the black matrix layer, may also increase, as illustrated in FIG. 11. That is, referring to FIGS. 11A and 11B, the area of an exposed part of the second electrode CAT of the first subpixel PX_1 may be greater than the area of an exposed part of the second electrode CAT of the first subpixel according to the comparative example of FIG. 4.

Accordingly, the amount of vertical reflected light L_RCa from the second electrode CAT may further increase, as compared to the comparative example of FIG. 4.

FIGS. 12 and 13 illustrate side incident light incident diagonally and side reflected light reflected diagonally. Referring to FIGS. 12 and 13, the side incident light may include side incident light L_ICb, which is diagonally incident upon the second electrode CAT at an angle α (where α is greater than 0° and smaller than 90°), and side incident light L_IAb, which is diagonally incident upon the first electrode ANO at the angle α, and the side reflected light may include side reflected light L_RCb, which is diagonally reflected from the second electrode CAT at the angle α, and side reflected light L_RAb, which is diagonally reflected from the first electrode ANO at the angle α.

As illustrated in FIGS. 12 and 13, as the first subpixel PX_1 includes the first bank island pattern BPDL_I_1 and the first black matrix island pattern BM_I_1, some of the side reflected light L_RCb, i.e., L_RCb', and some of the side reflected light L_RAb, i.e., L_RAb', may be absorbed by at least one of the first bank island pattern BPDL_I_1 and the first black matrix island pattern BM_I_1.

That is, the amounts of side reflected light L_RCb and side reflected light L_RAb may generally decrease.

FIG. 14, unlike FIGS. 12 and 13, illustrates side reflected light L_IB diagonally incident upon electrodes below the first electrode ANO and side reflected light L_RBa, L_RBb, and L_RBc diagonally reflected from the electrodes below the first electrode ANO. Some of the side reflected light L_RBa, L_RBb, and L_RBc may be absorbed by the first bank island pattern BPDL_I_1, as indicated by L_RBc, and some of the side reflected light L_RBa, L_RBb, and L_RBc may be absorbed by the black matrix island pattern BM_I_1, as indicated by L_RBb. Thus, the amount of side reflected light diagonally reflected from the electrodes below the first electrode ANO may generally decrease.

Referring to FIG. 15, the horizontal axis represents reflection angle(°, and the vertical axis represents reflective luminance, which may be proportional to the amount of reflected light. Referring to FIG. 15, a first trend line obtained by connecting first data (represented by filled circles) represents the reflective luminance of the first subpixel PX_1 of FIG. 2, and a second trend line obtained by connecting second data (represented by hollow circles) represents the reflective luminance of the first subpixel according to the comparative example of FIG. 4. The first trend line has a lower reflective luminance than the second trend line at a reflection angle of about −15° or less or about 15° or greater. The sum of an area S1 formed by the first and second trend lines at a reflection angle of about −15° or less and an area S2 formed by the first and second trend lines at a reflection angle of about 15° or greater is greater than an area S3 formed by the first and second trend lines at a reflection angle of about −15° to 15°, which means that the reflective luminance of the first subpixel PX_1 generally decreases.

Figure 16:
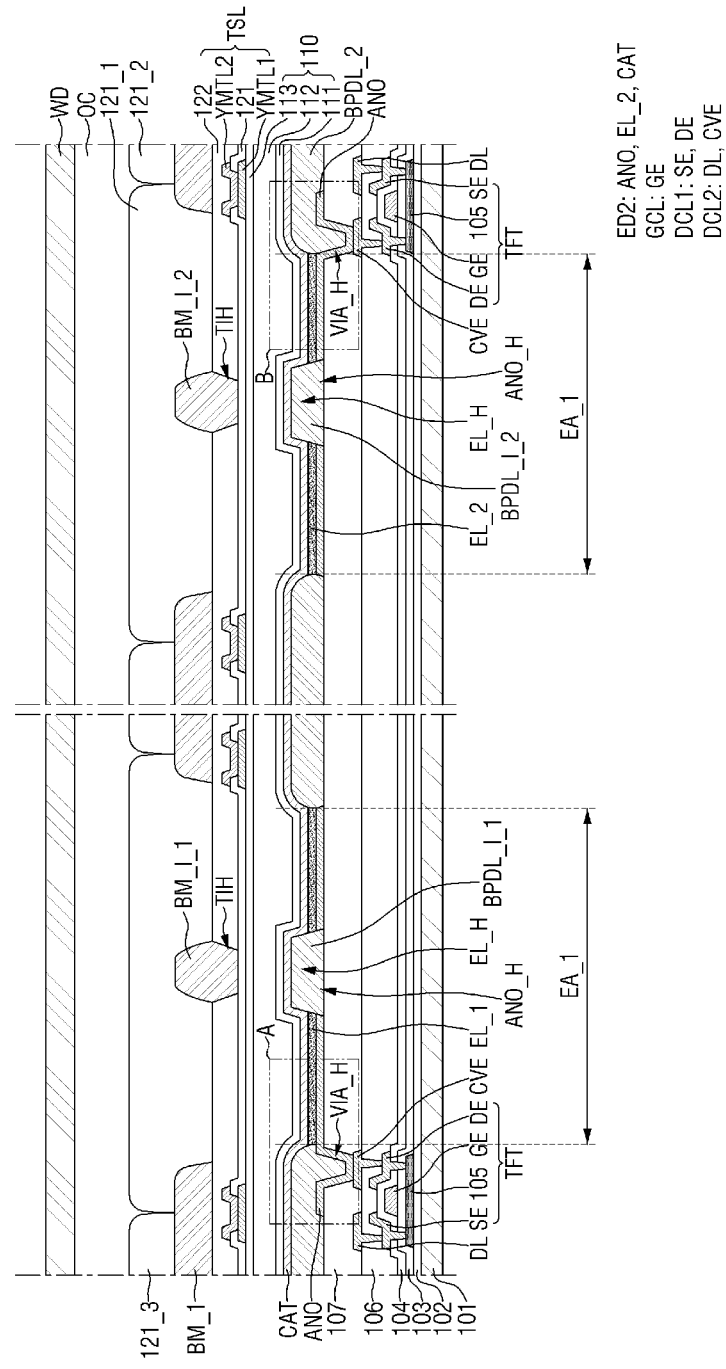
FIG. 16 is a cross-sectional view illustrating first and second subpixels of a pixel of a display device according to a modified example of the embodiment of FIG. 2.
Figure 17:
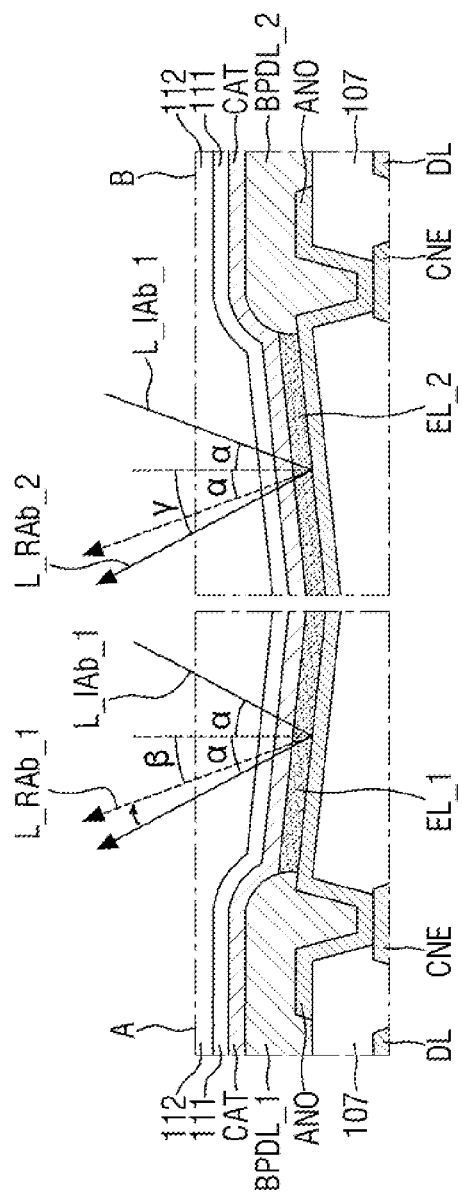
FIG. 17 is an enlarged cross-sectional view of areas A and B of FIG. 16.

FIG. 16 is a cross-sectional view illustrating first and second subpixels of a pixel of a display device according to a modified example of the embodiment of FIG. 2. FIG. 17 is an enlarged cross-sectional view of areas A and B of FIG. 16.

Referring to FIGS. 16 and 17, the display device differs from the display device of FIG. 8 in that a via hole VIA_H of a first emission area of a first subpixel PX_1 and a via hole VIA_H of a second emission area of the first subpixel PX_1 are opposite to each other with respect to the centers of bank island patterns BPDL_I_1 and BPDL_I_2.

Specifically, in a cross-sectional view, the via hole VIA_H of the first emission area of the first subpixel PX_1 and the via hole VIA_H of the second emission area of the first subpixel PX_1 may be opposite to each other with respect to the centers of the bank island patterns BPDL_I_1 and BPDL_I_2.

The via holes VIA_H may overlap with contact pads CVE in a thickness direction. That is, second insulating layers 107, which are adjacent to the via holes VIA_H, may overlap parts of the contact pads CVE. As described above, each of the second insulating layers 107 may include an organic insulating material and may be formed to have a substantially flat top surface while sufficiently covering a second data conductive layer. However, as the second insulating layers 107 overlap with the contact pads CVE, the top surfaces of the second insulating layers 107 may not be flat, but may be inclined, as illustrated in FIG. 17.

Accordingly, the slope of a first electrode ANO of the first emission area may have a different sign from the slope of a first electrode ANO of the second emission area. Also, the slope of a first emission layer EL_1 of the first emission area may have a different sign from the slope of a second emission layer EL_2 of the second emission area.

Therefore, as illustrated in FIG. 17, even if side incident light L_IAb_1 and L_IAb_2 is incident upon the first electrodes ANO of the first and second subpixels PX_1 and PX_2 at the same incident angle α, the side incident light L_IAb_1 and L_IAb_2 may be reflected from the first electrodes ANO of the first and second subpixels PX_1 and PX_2 at different reflection angles β and γ because the slope of the first electrode ANO of the first subpixel PX_1 has a different sign from the slope of the first electrode ANO of the second subpixel PX_2, and thus, an unexpected amount of reflected light can be obtained at a particular angle in the first and second emission areas.

According to the embodiment of FIGS. 16 and 17, as the first and second subpixels PX_1 and PX_2 include the bank island patterns BPDL_I_1 and BPDL_I_2, respectively, and black matrix island patterns BM_I_1 and BM_I_2, respectively, some of side reflected light L_RCb and L_RAb, i.e., L_RCb' and L_RAb', may be absorbed by the bank island patterns BPDL_I_1 and BPDL_I_2 and/or the black matrix island patterns BM_I_1 and BM_I_2 so that the amounts of side reflected light L_RCb and side reflected light L_RAb generally decrease. Thus, a difference in the amount of reflected light at any particular angle in each of the first and second emission areas can be considerably reduced.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a base substrate;
a thin-film transistor disposed on the base substrate;
a via layer disposed on the thin-film transistor and having a via hole formed therein, the via hole penetrating the via layer in a thickness direction;
a first electrode disposed on the via layer and having an electrode hole formed therein, the electrode hole penetrating the first electrode in the thickness direction;
a bank layer disposed on the first electrode and exposing part of a top surface of the first electrode;
an emission layer on the first electrode; and
a second electrode on the emission layer,
wherein the first electrode comprises a first portion on a first side of the electrode hole that is electrically connected to the thin-film transistor through the via hole and a second portion on a second side of the electrode hole that is entirely on an upper surface of the via layer,
wherein the first portion and the second portion are physically and electrically connected to each other, and
wherein the bank layer includes an outer bank pattern, which overlaps with the via hole in the thickness direction, and a bank island pattern, which is disposed in the electrode hole.

2. The display device of claim 1, wherein an emission hole, which penetrates the emission layer in the thickness direction, is formed and overlaps with the electrode hole in the thickness direction.

3. The display device of claim 2, wherein the emission layer is in contact with the outer bank pattern and the bank island pattern.

4. The display device of claim 2, wherein the second electrode is in contact with top surfaces of the outer bank pattern and the bank island pattern.

5. The display device of claim 2, wherein the bank island pattern absorbs light reflected from a conductive layer below the first electrode.

6. The display device of claim 2, further comprising:
a thin-film encapsulation layer disposed on the second electrode.

7. The display device of claim 6, further comprising:
a touch sensor layer disposed on the thin-film encapsulation layer.

8. The display device of claim 7, wherein
the touch sensor layer includes a first touch conductive layer, which is disposed on the thin-film encapsulation layer, a first touch insulating layer, which is disposed on the first touch conductive layer, a second touch conductive layer, which is disposed on the first touch insulating layer, and a second touch insulating layer, which is disposed on the second touch conductive layer and has a touch insulating hole formed therein, and
the touch insulating hole penetrates the second touch insulating layer in the thickness direction.

9. The display device of claim 8, wherein the touch insulating hole overlaps with the bank island pattern in the thickness direction.

10. The display device of claim 2, wherein in a plan view, each of the electrode hole and the bank island pattern is surrounded by the first electrode.

11. The display device of claim 10, wherein in a plan view, the emission hole is completely surrounded by the emission layer.

12. A display device comprising:
a base substrate;
a thin-film transistor disposed on the base substrate;
a via layer disposed on the thin-film transistor and having a via hole formed therein, the via hole penetrating the via layer in a thickness direction;
a first electrode disposed on the via layer and having an electrode hole formed therein, the electrode hole penetrating the first electrode in the thickness direction;
a bank layer disposed on the first electrode and exposing part of a top surface of the first electrode;
an emission layer on the first electrode; and
a second electrode on the emission layer,
wherein the first electrode is electrically connected to the thin-film transistor through the via hole,
wherein the bank layer includes an outer bank pattern, which overlaps with the via hole in the thickness direction, and a bank island pattern, which is disposed in the electrode hole,
wherein an emission hole, which penetrates the emission layer in the thickness direction, is formed and overlaps with the electrode hole in the thickness direction
wherein the display device further comprises a thin-film encapsulation layer disposed on the second electrode, and a touch sensor layer disposed on the thin-film encapsulation layer,
wherein the touch sensor layer includes a first touch conductive layer, which is disposed on the thin-film encapsulation layer, a first touch insulating layer, which is disposed on the first touch conductive layer, a second touch conductive layer, which is disposed on the first touch insulating layer, and a second touch insulating layer, which is disposed on the second touch conductive layer and has a touch insulating hole formed therein, and
wherein the touch insulating hole penetrates the second touch insulating layer in the thickness direction,
wherein the touch insulating hole overlaps with the bank island pattern in the thickness direction,
wherein the display device further comprises a black matrix layer disposed on the second touch insulating layer, and
wherein the black matrix layer includes an outer black matrix pattern, which overlaps with the outer bank pattern, and a black matrix island pattern, which is disposed in the touch insulating hole.

13. The display device of claim 12, further comprising:
a color filter layer disposed on the black matrix layer.

14. The display device of claim 12, wherein the black matrix island pattern absorbs light reflected from the first electrode and/or the second electrode from an outside.

15. The display device of claim 14, wherein the black matrix island pattern absorbs light diagonally reflected from a conductive layer below the first electrode from an outside.

16. The display device of claim 15, wherein in a plan view, the black matrix island pattern is completely surrounded by the second touch insulating layer.

17. A display device comprising:
a first emission area that emits light of a first color; and
a second emission area that emits light of a second color, which is different from the first color,
wherein each of the first and second emission areas includes:
a base substrate,
a thin-film transistor disposed on the base substrate,
a via layer disposed on the thin-film transistor and having a via hole formed therein, the via hole penetrating the via layer in a thickness direction,
a first electrode disposed on the via layer and having an electrode hole formed therein, the electrode hole penetrating the first electrode in the thickness direction,
a bank layer disposed on the first electrode and exposing part of a top surface of the first electrode,
an emission layer on the first electrode, and
a second electrode on the emission layer,
wherein the first electrode comprises a first portion on a first side of the electrode hole that is electrically connected to the thin-film transistor through the via hole and a second portion on a second side of the electrode hole that is entirely on an upper surface of the via layer,
wherein the first portion and the second portion are physically and electrically connected to each other, and
wherein the bank layer includes an outer bank pattern, which overlaps with the via hole in the thickness direction, and a bank island pattern, which is disposed in the electrode hole.

18. The display device of claim 17, wherein in a plan view, the via holes of the first and second emission areas are opposite to each other with respect to centers of the bank island patterns.

19. The display device of claim 18, wherein a slope of the first electrode of the first emission area has a different sign from a slope of the first electrode of the second emission area.

20. The display device of claim 19, wherein a slope of the emission layer of the first emission area has a different sign from a slope of the emission layer of the second emission area.

* * * * *